United States Patent
Mori et al.

(10) Patent No.: US 7,030,028 B2
(45) Date of Patent: Apr. 18, 2006

(54) ETCHING METHOD (75) Inventors: Takuya Mori, Yamanashi (JP);
Koichiro Inazawa, Yamanashi (JP);
Noriyuki Kobayashi, Yamanashi (JP);
Masahito Sugiura, Yamanashi (JP);
Yoshihiro Hayashi, Tokyo (JP); Keizo Kinoshita, Tokyo (JP)

(73) Assignees: Tokyo Electron Limited, Tokyo (JP);
NEC Corporation, Tokyo (JP)

( * ) Notice: Subject to any disclaimer, the term of this patent is extended or adjusted under 35 U.S.C. 154(b) by 0 days.

(21) Appl. No.: 10/312,292

(22) PCT Filed: Jun. 26, 2001

(86) PCT No.: PCT/JP01/05442

§ 371 (c)(1),
(2), (4) Date: Sep. 29, 2003

(87) PCT Pub. No.: WO02/01619

PCT Pub. Date: Jan. 3, 2002

(65) Prior Publication Data

US 2004/0063331 A1 Apr. 1, 2004

(30) Foreign Application Priority Data

Jun. 26, 2000 (JP) .............................. 2000-191378

(51) Int. Cl.
*H01L 21/302* (2006.01)

(52) U.S. Cl. ...................... 438/712; 438/718; 438/724; 438/725

(58) Field of Classification Search ................ 438/700, 438/712, 718, 724, 725
See application file for complete search history.

(56) References Cited

U.S. PATENT DOCUMENTS

| 6,017,817 | A  | * | 1/2000  | Chung et al. | ................ 438/637 |
| 6,159,661 | A  | * | 12/2000 | Huang et al. | ................ 430/313 |
| 6,284,149 | B1 | * | 9/2001  | Li et al.    | ........................ 216/64 |
| 6,309,962 | B1 | * | 10/2001 | Chen et al.  | ................ 438/638 |
| 6,313,028 | B1 | * | 11/2001 | Huang et al. | ................ 438/637 |

FOREIGN PATENT DOCUMENTS

| JP | 2000-114373 | 4/2000 |
| JP | 2000-269329 | 9/2000 |

\* cited by examiner

*Primary Examiner*—Nadine G. Norton
*Assistant Examiner*—Binh X. Tran
(74) *Attorney, Agent, or Firm*—Finnegan, Henderson, Farabow, Garrett & Dunner, LLP (57) ABSTRACT

A dual damascene structure with a lesser degree of shoulder loss is achieved. In a method for forming a dual damascene structure having a shoulder in an organic low k film layer by dry-etching the organic low k film layer 208 and a mask layer 210 formed over the organic low k film 208 using at least two different mixed gases, a first step in which the mask layer is etched using a first process gas and then the organic low k film layer is etched into a predetermined depth by continuously using the first process gas and a second step following the first step, in which the organic low k film layer is etched using a second process gas are executed. Since a protective wall is formed at a side wall of a via during the first step, the extent of the shoulder loss occurring in the junction region where a trench and a via form a junction can be reduced.

15 Claims, 9 Drawing Sheets

③ SiN Trench Etch

(a)

④ SiLK Trench Etch (b)

⑤ SiN Etch (c)

| slot | (electron) binding energy intensity ratio* | | |
|---|---|---|---|
| | CHF—CH$_2$ | CHF—CHF | total |
| 24 | 0 | 6 | 6 |
| 25 | 9 | 7 | 16 |

\* the ratios were each calculated as the ratio of the peak area of CHF-CH2 or CHF - CHF obtained by subtracting the peak area at the blank level from the peak area of the CHF-CH2 or CHF - CHF relative to the peak area of C - C (SiLK) set at 100

ETCHING METHOD

TECHNICAL FIELD

The present invention relates to an etching method.

BACKGROUND ART

As higher integration in semiconductor integrated circuits is pursued with increasing vigor, rapid progress has been made in the field of the technology for manufacturing multilayered semiconductor devices in recent years. It is necessary to form both trench wiring to connect elements arranged along the horizontal direction and via hole wiring to connect elements arranged along the vertical direction when manufacturing a semiconductor device with a multi-layer structure. In recent years, copper is used as the wiring material and an organic low k material due to its low resistance and outstanding antielectro-migration characteristics such as SiLK™ (a product of Dow Chemical, U.S., hereafter referred to as SiLK), which assures a low dielectric constant is used as a layer insulating material in the manufacturing process to achieve faster integrated circuits.

A wiring pattern is formed with copper, with which a compound with a high vapor pressure cannot easily be formed, by adopting a so-called damascene structure with an embedded wiring achieved through metal CMP technology. In addition, semiconductor elements with a so-called dual damascene structure achieved by simultaneously forming trench wirings for connecting the individual elements arranged along the horizontal direction and via wirings for connecting the elements arranged along the vertical direction have become increasingly common recently.

When a via is formed at a trench formed in a layer insulating film constituted of an organic low k film in the dual damascene structure forming technology in the related art, so-called shoulder loss tends to occur readily over a junction region (a via edge portion) where the trench and a via form a junction. If wirings are formed with vias where such shoulder loss has occurred, the electric capacitance between adjacent via wirings increases, which gives rise to a problem in that the desired electrical characteristics cannot be assured.

An object of the present invention, which has been completed by addressing the problem of the dual damascene structure formation in the related art, is to provide a new and improved etching method that does not allow shoulder loss to occur readily at the shoulder of an organic low k film layer when, for instance, forming a via at a trench formed in the layer insulating film constituted of the organic low k film and thus, makes it possible to achieve a wiring structure in a desired shape and with desired dimensions when wirings are embedded through a subsequent process.

DISCLOSURE OF THE INVENTION

In order to achieve the object described above, the present invention presents a new and improved method through which a dual damascene structure with a shoulder formed in an organic low k film layer is achieved by dry-etching the organic low k film and a mask layer formed over the organic low k film using at least two process gases.

Namely, the method achieved in a first aspect of the present invention is characterized in that it includes a first step in which after a mask layer is etched by using a first process gas, an organic low k film layer is etched to a predetermined depth by continuously using the first process gas and a second step executed after the first step, in which the organic low k film layer is etched by using a second process gas.

The method achieved in a second aspect of the present invention is characterized in that it includes a first step in which after a silicon nitride layer is etched by using a first process gas, an organic low k film layer is etched at least to a depth matching the position of a shoulder in the dual damascene structure by continuously using the first process gas and a second step executed after the first step, in which the organic low k film layer is etched by using a second process gas.

To describe the features of the present invention in further detail, the first process gas may contain, at least, C and F. For instance, the first process gas may be a process gas constituted of $CF_4$, $O_2$ and Ar.

In addition, the second process gas may contain, at least, N and H. Such a second-process gas may be a mixed gas containing $N_2$ and $H_2$.

Through the method according to the present invention, after the mask layer such as a SiN layer is etched by using the first process gas, e.g., a mixed gas constituted of $CF_4$, $O_2$ and Ar, the same process gas is continuously used to etch the organic low k film to a predetermined depth, e.g., to a point at least deep enough to match the position of the shoulder in the dual damascene structure, so as to allow a protective wall constituted of, for instance, a C—F polymer to become deposited at a via side wall during the dual damascene structure formation. When the trench is etched by using the second process gas such as a mixed gas constituted of $N_2$ and $H_2$ subsequently, the deposited polymer functions as a protective wall to reduce the extent of shoulder loss occurring in the junction region where the via and the trench form a junction. As a result, the shoulder achieves an almost perfectly vertical shape which is considered to be ideal and thus, a wiring structure achieving the desired electrical characteristics is realized.

BEST MODE FOR CARRYING OUT THE INVENTION

The following is an explanation of a preferred embodiment of the etching method according to the present invention, given in reference to the attached drawings. It is to be noted that the same reference numerals are assigned to members achieving substantially identical functions and structural features in the following explanation and the attached drawings to preclude the necessity for a repeated explanation of thereof.

Figure 1:
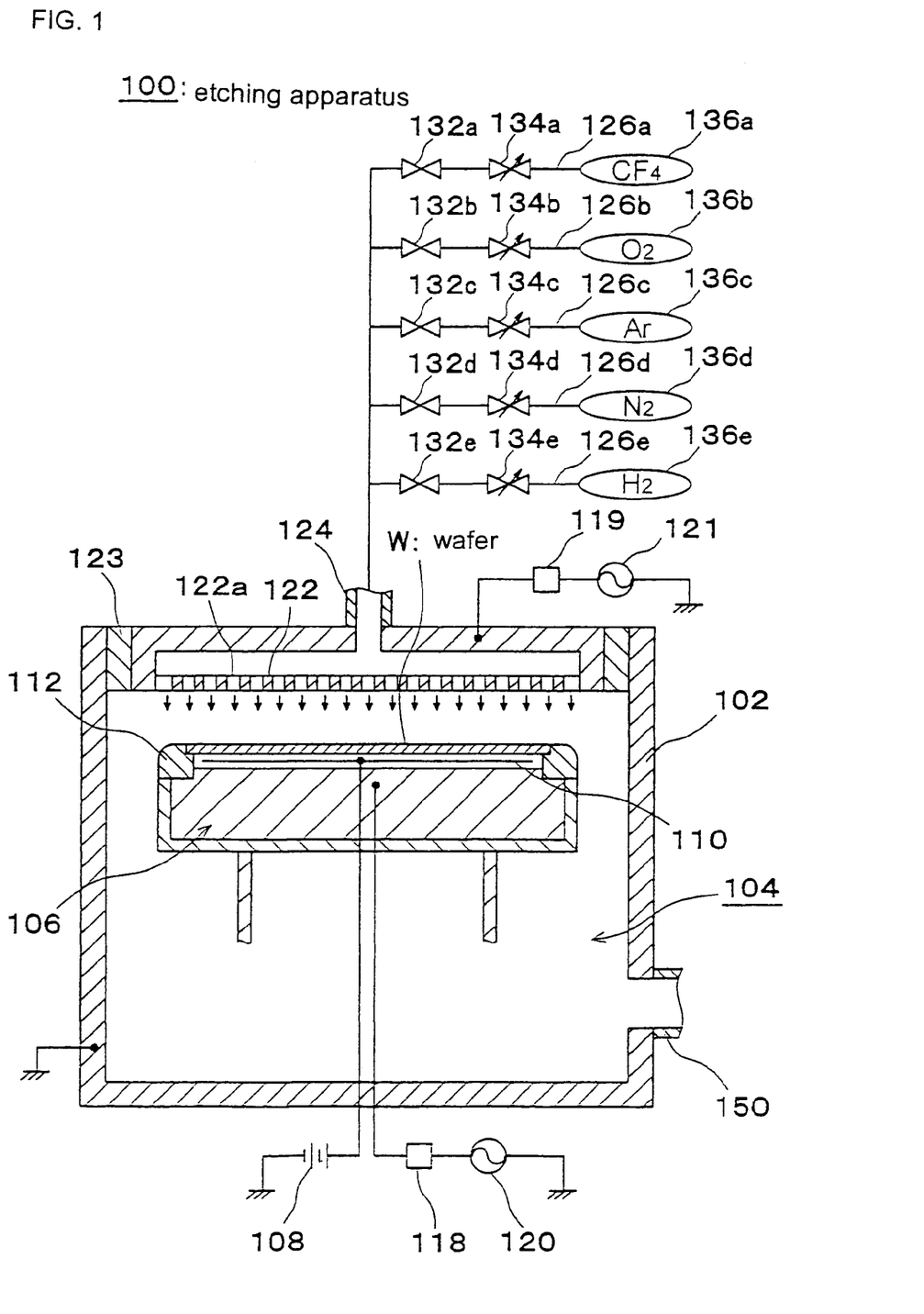
FIG. 1 is a schematic diagram showing the structure of an etching apparatus in which the present invention may be adopted.

First, the structure of a plane-parallel type plasma etching apparatus is briefly explained as an example of an etching apparatus in which the etching method achieved in the embodiment may be adopted, in reference to FIG. 1.

A processing chamber 104 is formed inside a processing container 102 which is grounded for safety in an etching apparatus 100 in the figure, with a lower electrode 106 constituting a susceptor capable of moving up/down freely provided inside the processing chamber 104. At the top of the lower electrode 106, an electrostatic chuck 110 connected to a high-voltage DC source 108 is provided, and a workpiece such as a semiconductor wafer (hereafter referred to as a "wafer") W is placed on the upper surface of the electrostatic chuck 110. An insulating focus ring 112 is set around the wafer W placed on the lower electrode 106. A high-frequency source 120 is connected to the lower electrode 106 via a matcher 118.

At the ceiling of the processing chamber 104 facing opposite the surface of the lower electrode 106 on which the workpiece is placed, an upper electrode 122 having numerous gas outlet holes 122a is provided. The upper electrode 122 and the processing container 102 are electrically insulated from each other by an insulator 123 provided between them. A high-frequency source 121 which outputs plasma-generating high-frequency power is connected to the upper electrode 122 via a matcher 119. A gas supply pipe 124 is connected with the gas outlet holes 122a, and first process gas supply systems 126a, 126b and 126c that supply a first process gas, e.g., a gas containing at least C and F and, more specifically, CF$_4$, O$_2$ and Ar constituting a first process gas, and second process gas supply systems 126d and 126e that supply a second process gas, e.g., a gas containing at least N and H and, more specifically, N$_2$ and H$_2$ constituting the second process gas, are connected to the gas supply pipe 124.

A CF$_4$ gas supply source 136a, an O$_2$ gas supply source 136b and an Ar gas supply source 136c that provide the first process gas are respectively connected to the first process gas supply systems 126a, 126b and 126c via switching valves 132a, 132b and 132c and flow-regulating valves 134a, 134b and 134c. An N$_2$ gas supply source 136d and an H$_2$ gas supply source 136e that provide the second process gas are respectively connected to the second process gas supply systems 126d and 126e via switching valves 132d and 132e and flow-regulating valves 134d and 134e.

Near the bottom of the processing container 102, an evacuating pipe 150 communicating with an evacuating mechanism (not shown) is connected, and by engaging the evacuating mechanism in operation, the atmosphere inside the processing chamber 104 can be maintained at a predetermined pressure, the level of which is lowered by a specific extent.

Next, the process of forming the dual damascene structure in the embodiment by using the etching apparatus described above is explained in reference to FIGS. 2, 3 and 4. The figures illustrate steps through which a via wiring which connects an upper layer circuit pattern to a Cu wiring 204 in a lower layer circuit pattern and a trench wiring that connects to upper layer circuit patterns are formed at the same time.

Figure 2:
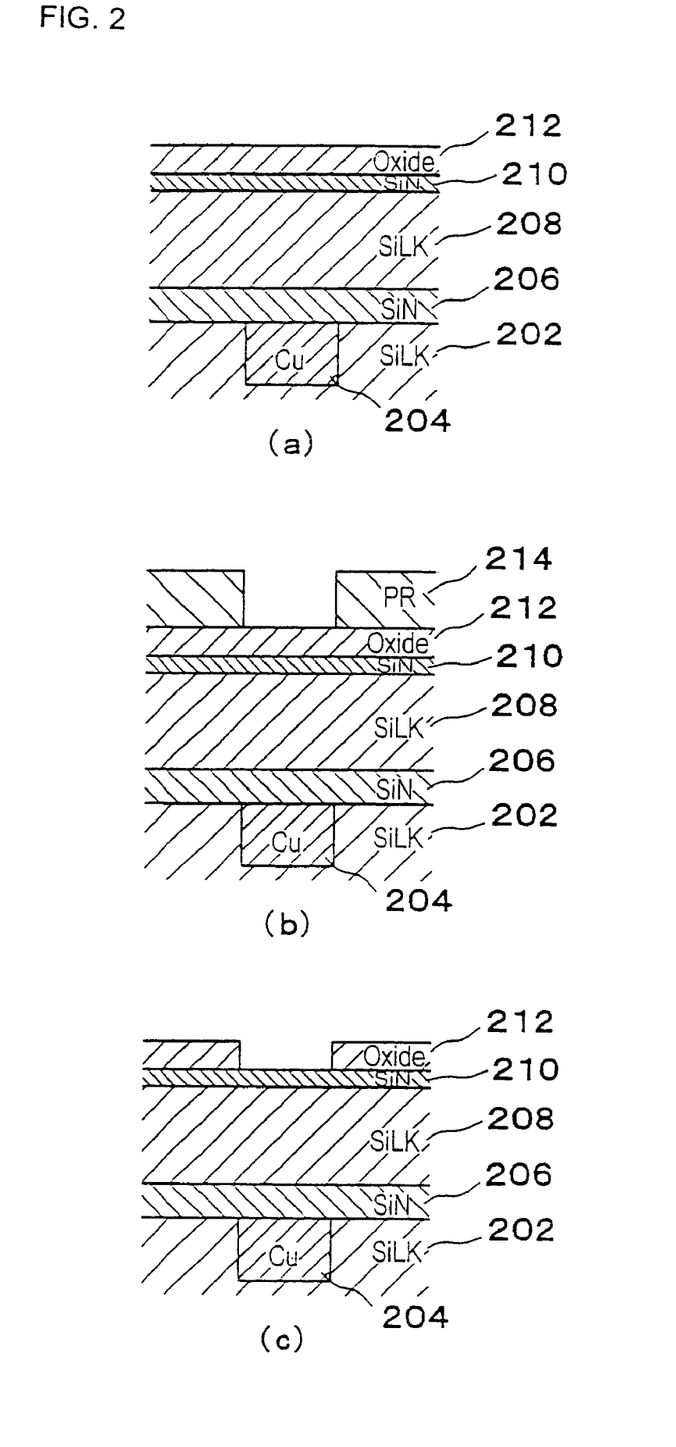
FIG. 2 illustrates the steps taken in the etching method achieved in an embodiment.

As shown in FIG. 2(a), the Cu wiring 204 of a lower layer circuit pattern is formed in a SiLK layer 202. Over the SiLK layer 202, an SiN layer 206 to work as a protective film, a SiLK layer 208 formed as an organic low k film constituting a layer insulating film layer, and an SiN layer 210 and an oxide film layer 212 respectively constituting a first hard mask and a second hard mask to be used during the formation of a trench and a via are formed.

Next, as shown in FIG. 2(b), a photoresist (PR) layer for trench formation is formed and a trench TR pattern 214 is formed through a specific lithography process. Then, as shown in FIG. 2(c), the oxide film layer 212 is etched by using the trench PR pattern 214, thereby forming a trench hard mask and also the trench PR pattern 214 is removed through ashing.

Figure 3:
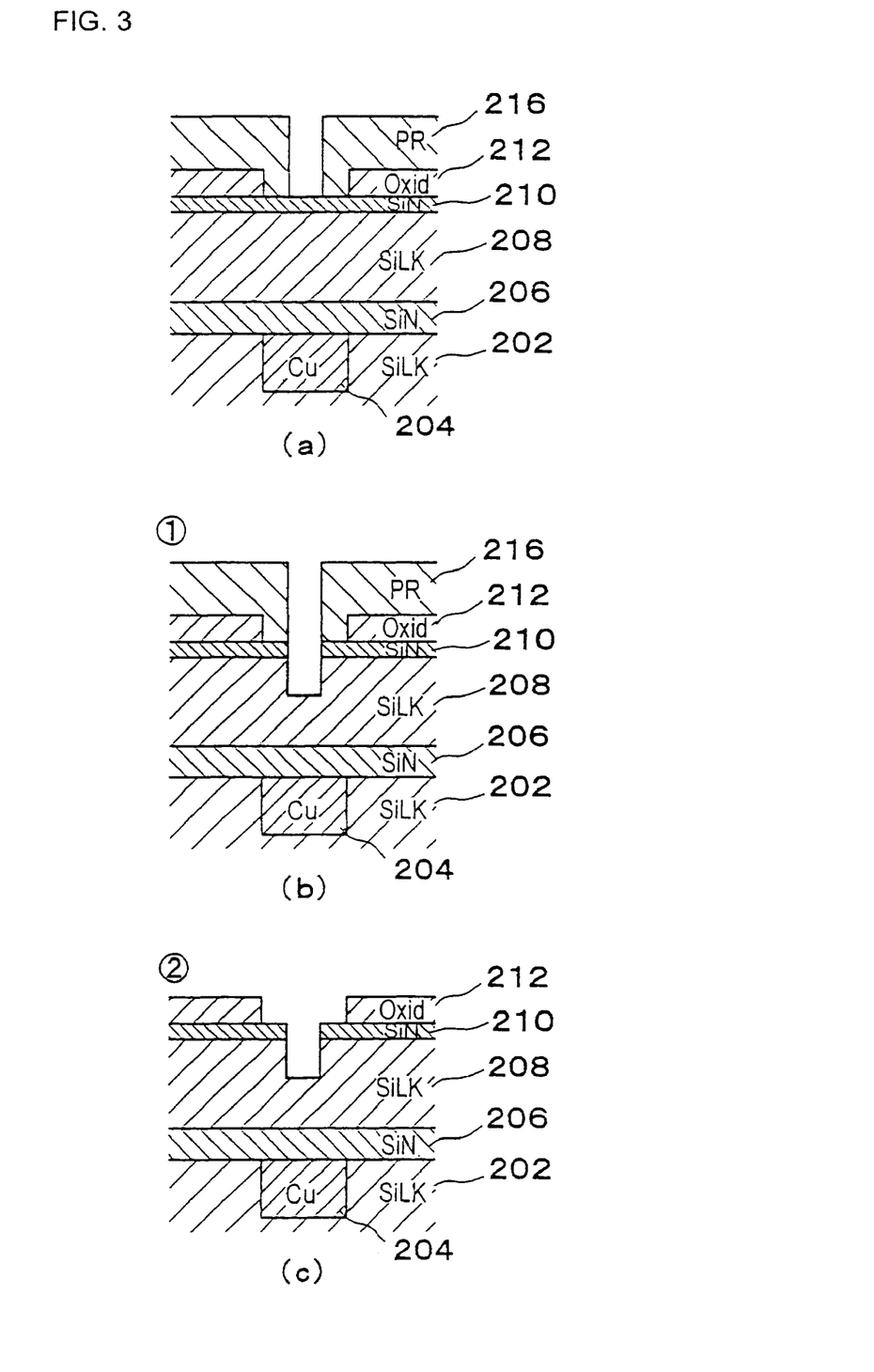
FIG. 3 illustrates the steps taken in the etching method achieved in the embodiment.

Next, as shown in FIG. 3(a), a photoresist (PR) layer for via formation is formed and a via PR pattern 216 is formed through a specific lithography process. Then, as shown in FIG. 3(b), the via PR pattern 126 is used to first etch the SiN layer 210 thereby forming a via hard mask, and subsequently, the via hard mask is used to etch a via in the SiLK layer 208 constituted of the organic low k film.

In the embodiment, when the step (step 1) shown in FIG. 3(b) is executed, the first process gas such as a mixed gas constituted of CF$_4$, O$_2$ and Ar, which causes the SiN constituting the hard mask and the SiLK constituting the organic low k film to be etched, is first used to etch the SiN layer and then the first process gas is continuously used to over-etch the organic low k film to a predetermined depth, e.g., to a point at least deep enough to match the position of the shoulder in a dual damascene structure. Through this processing, a protective wall constituted of, for instance, a C—F polymer can be deposited at a side wall of the via formed at the organic low k film.

Next, the PR pattern 216 is ashed as shown in FIG. 3(c) (step 2) and the SiLK layer 208 is further etched to achieve a greater depth for the via hole. In the embodiment, the second process gas which allows the via PR pattern 216 and the SiLK layer 208 to achieving high selection ratios relative to the hard mask layers such as a mixed gas constituted of N$_2$ and H$_2$ is used during this process to ash the via PR pattern 216 and etch the SiLK layer 208.

Figure 4:
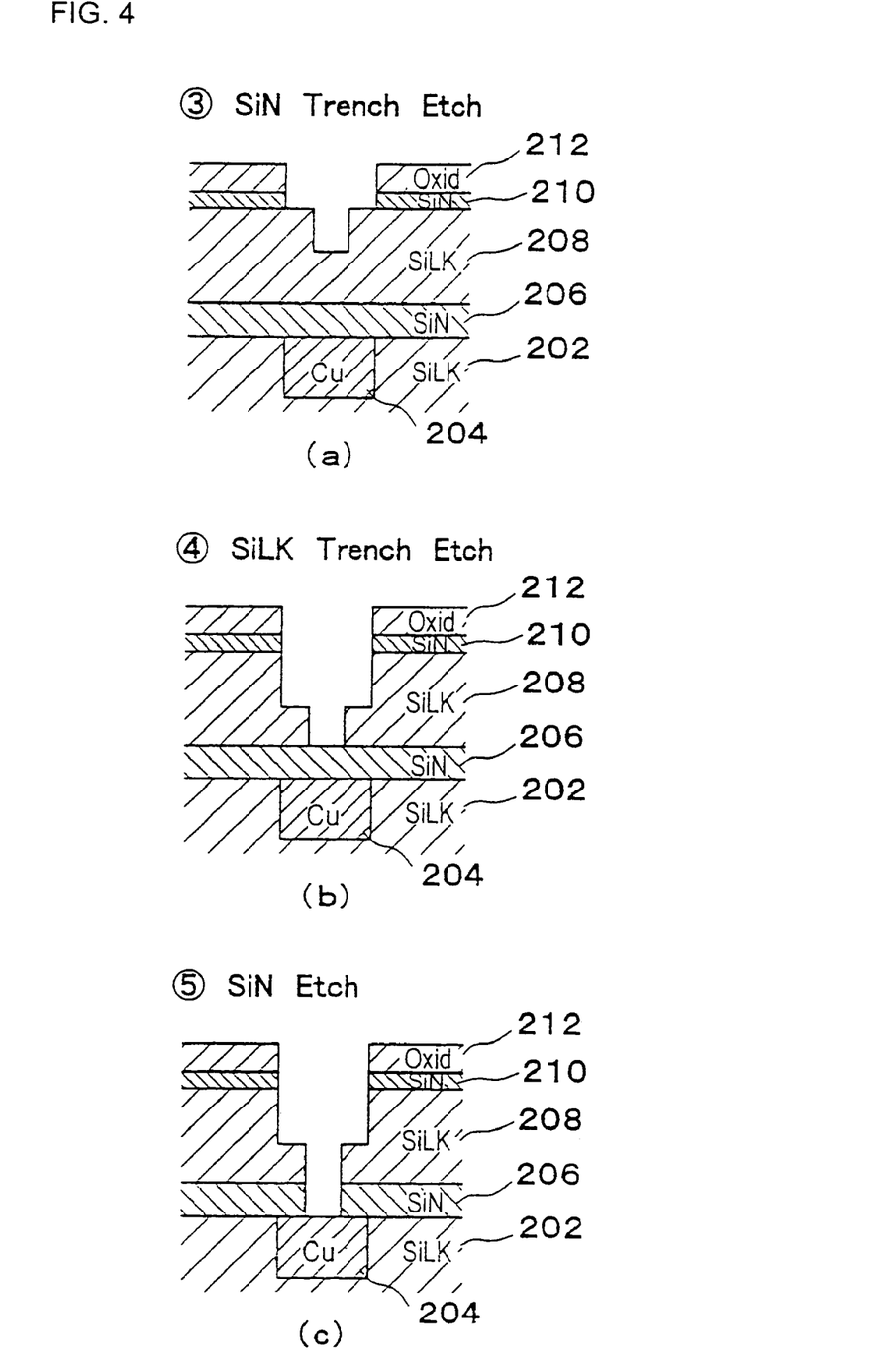
FIG. 4 illustrates the steps taken in the etching method achieved in the embodiment.
Figure 5:
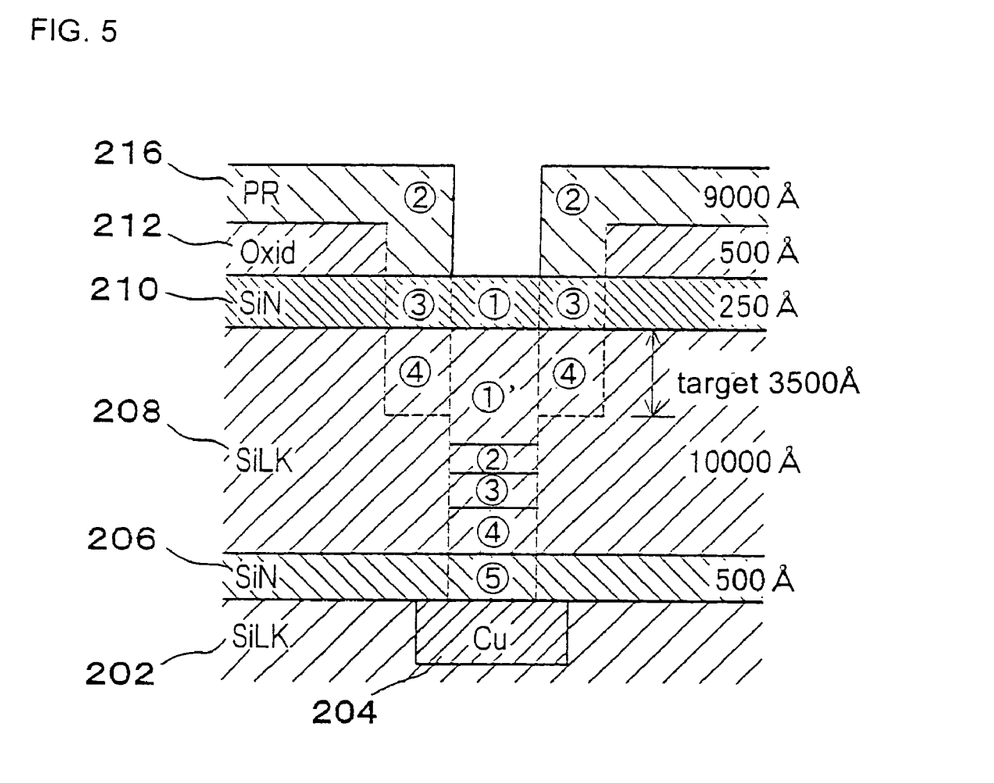
FIG. 5 schematically shows the dual damascene structure achieved in the embodiment.

Then, as shown in FIG. 4(a) (step 3) a third process gas which allows the SiN layer 210 to achieve a high selection ratio relative to oxide, such as a mixed gas constituted of CH$_2$F$_2$, O$_2$ and Ar, is used to etch the SiN layer 210 by using the oxide film layer 212 as a hard mask, thereby forming the trench hard masks 210 and 212 constituted of the oxide film layer 212 and the SiN layer 210.

Next, as shown in FIG. 4(b) (step 4), the SiLK layer 208 is etched by using the trench hard masks 210/212 after switching back to the second process gas which allows the SiLK layer 208 to achieve a high selection ratio relative to the hard mask layers to form a trench above the via and also to etch the via deeper until it reaches the top of the SiN layer 206.

When the etching the trench with the second process gas during steps 2 and 4, the polymer deposited at the via side wall during step 1 works as a protective wall in the embodiment. As a result, an advantage of reducing to the extent of the shoulder loss occurring at the junction region where the via and the trench form a junction is achieved.

Next, as shown in FIG. 4(c) (step 5), after switching back to the third process gas which allows the SiN to achieve a high selection ratio relative to the hard masks, SiLK and Cu, the SiN layer 206 formed above the Cu wiring 204] is etched to allow the via to pass through the SiN layer 206.

A dual damascene structure having a trench and a via formed at the same time is achieved as described above. Then, by embedding Cu or a metal containing Cu (not shown) in the trench and the via, the wiring process is completed.

To better illustrate the features of the etching method achieved in the embodiment which has been explained in reference to FIGS. 2–4, FIG. 5 shows the layers etched or ashed through steps 1–5 by marking them with the numbers of the corresponding steps in which they are processed, with specific values of film thicknesses that may be achieved for the individual layers provided for reference. As FIG. 5 indicates, in the embodiment, when etching the SiN layer with the via PR pattern for via formation by using the first process gas, the etching process is intentionally carried on beyond the SiN layer to form a via with a predetermined depth in the SiLK layer as well. Then, by etching the SiLK layer further down to achieve a greater depth for the via (marked as 1') formed in the SiLK layer through the step described above relative to the depth of the trench (marked with 4) to be formed in a subsequent step, the via having a protective wall formed at its side wall can be formed in advance. As a result, when forming the trench in the subsequent step, the shoulder loss at the junction region where the trench and the via form a junction can be effectively prevented.

Figure 6:
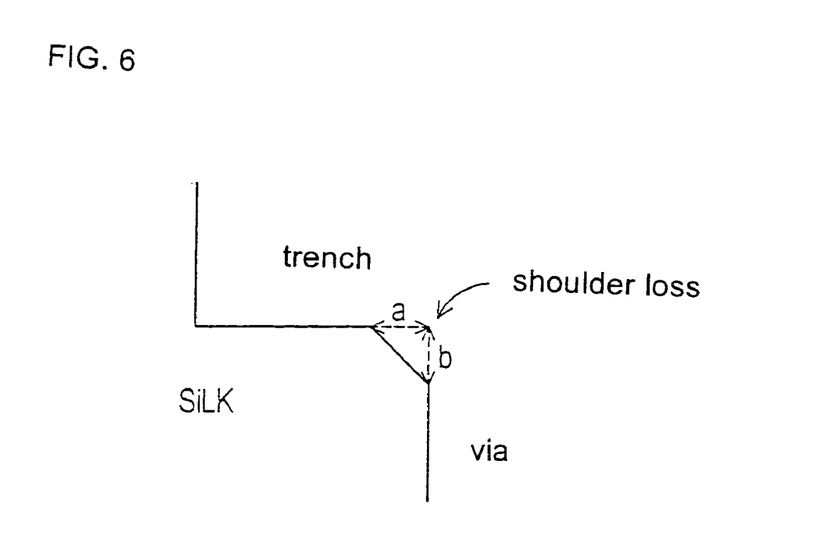
FIG. 6 illustrates shoulder loss occurring in a junction region where a trench and a via form a junction.
Figure 7:
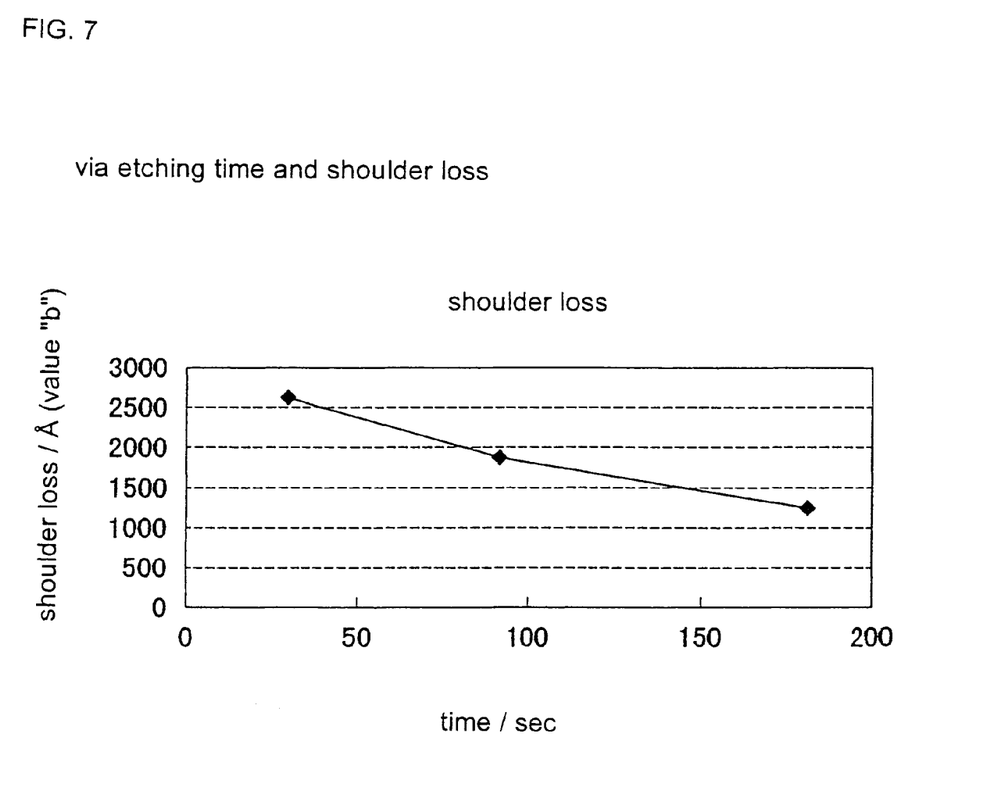
FIG. 7 presents a graph of the relationship between the via etching time and shoulder loss.

Next, to better demonstrate the advantage of the etching method achieved in the embodiment, the relationship between the length of the SiN via etching time at and the shoulder loss is explained in reference to FIGS. 6 and 7.

As shown in FIG. 6, a shoulder S is formed over the junction region where the trench and the via formed in the SiLK layer form a junction. It is ideal for the shoulder S to be perfectly vertical. However, a shoulder loss occurs in reality since the shoulder, too, is bound to become etched during the formation of the via. The extent of this shoulder loss can be expressed by using a value "a" and a value "b" as shown in FIG. 6, and the shoulder achieves a better shape as value "a" and value "b" become smaller.

FIG. 7 shows the relationship between the extent of shoulder loss (value "b") and the length of via etching time. As shown in the figure, the extent of the shoulder loss becomes less as the length of via etching time increases. This is assumed to be attributable to the presence of the protective wall formed at the via side wall by continuously etching the via into the SiLK layer where the trench is formed after the via is etched in the SiN layer, instead of etching the SiN layer (marked as in FIG. 5) alone as in the related art.

Figure 8:
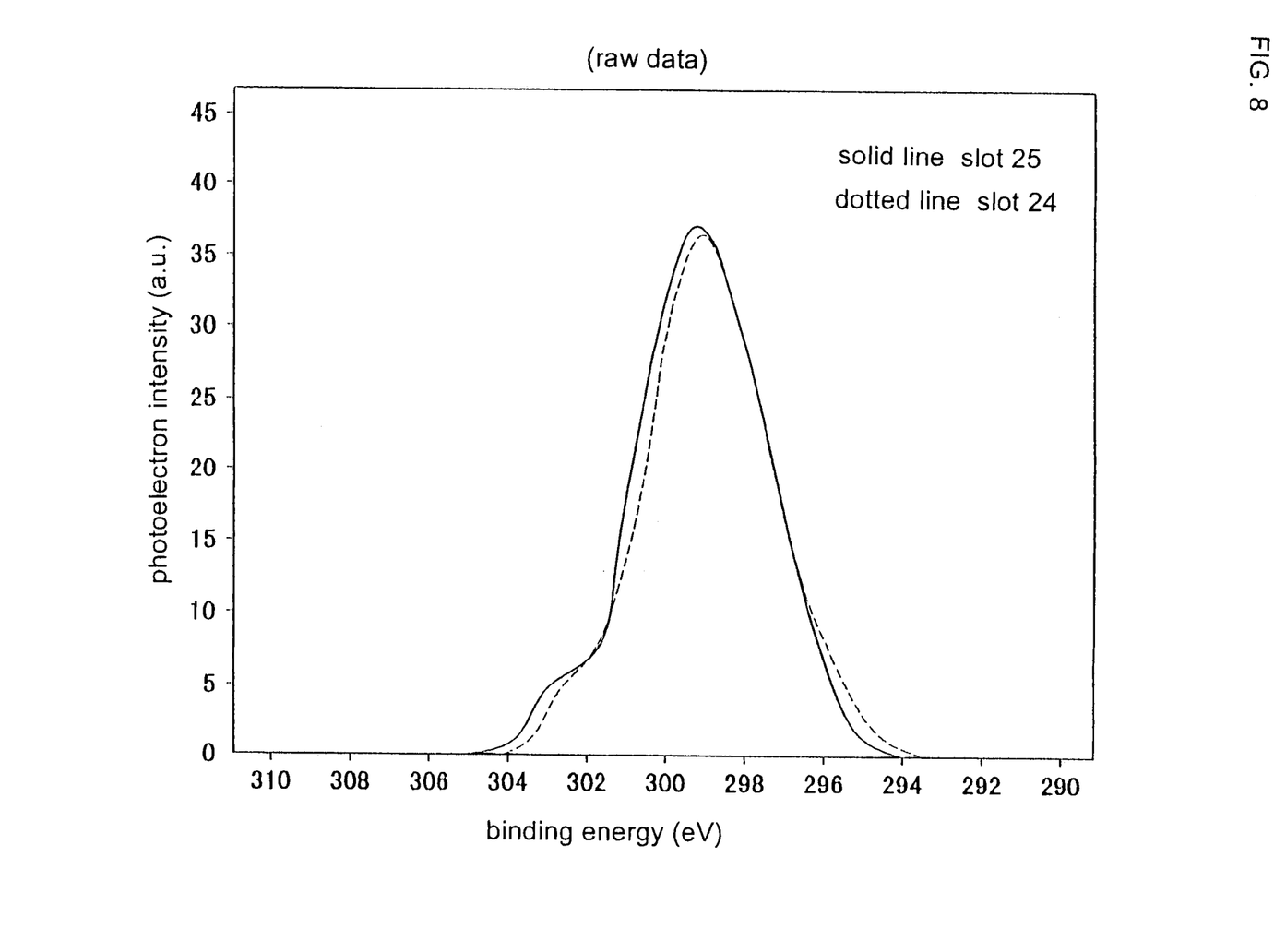
FIG. 8 presents a graph of the C1s orbit photoelectron intensity observed by increasing the length of the over-etching time (slot 25) and reducing the length of the over-etching time (slot 24)
Figure 9:
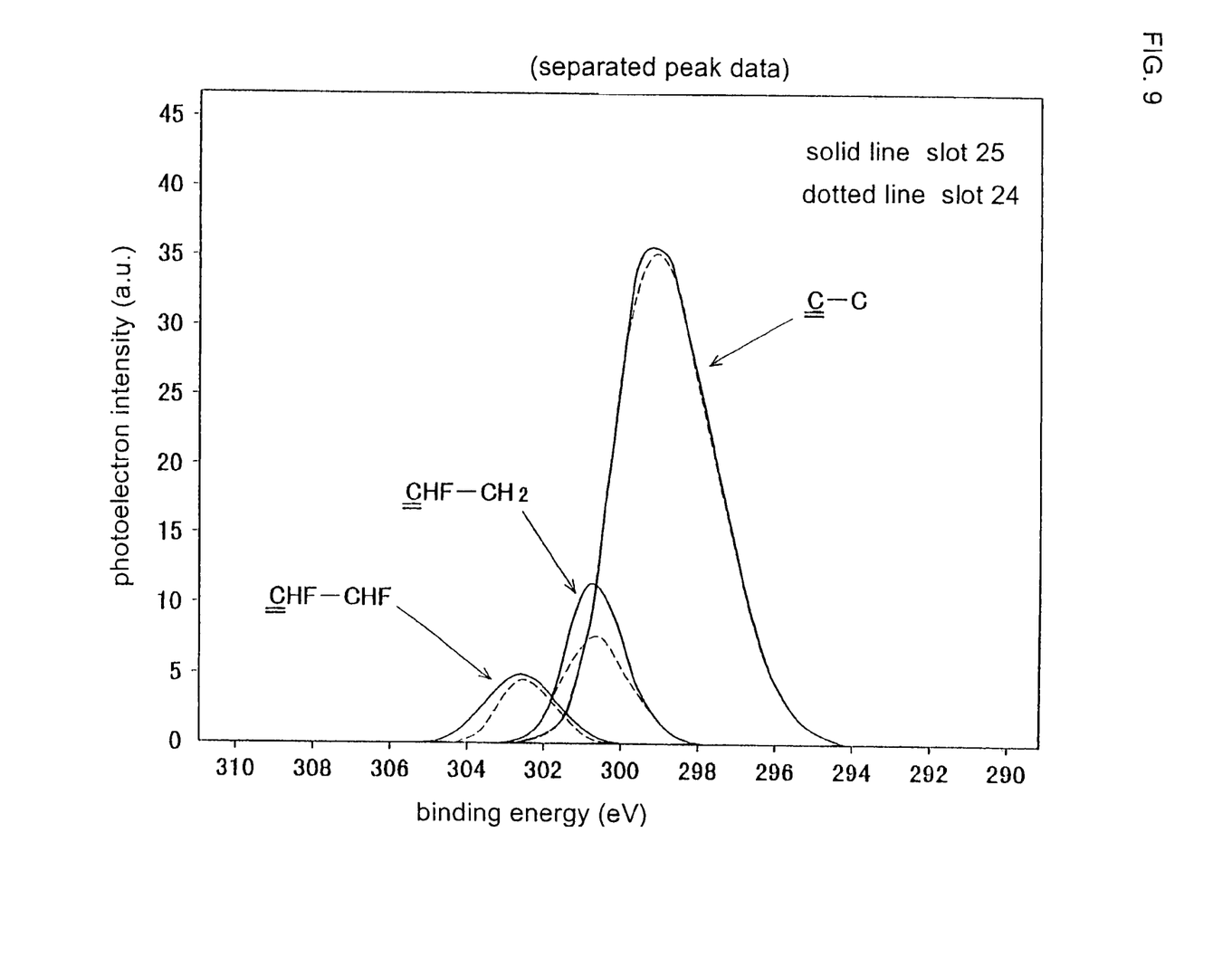
FIG. 9 presents a graph showing the results of separating the C1s orbit photoelectron spectra into an SiLK peak, a CHF—$CH_2$ peak and a CHF—CHF peak, using photoelectron spectra obtained by increasing the length of the over-etching time (slot 25) and reducing the length of over-etching time (slot 24)
Figure 10:
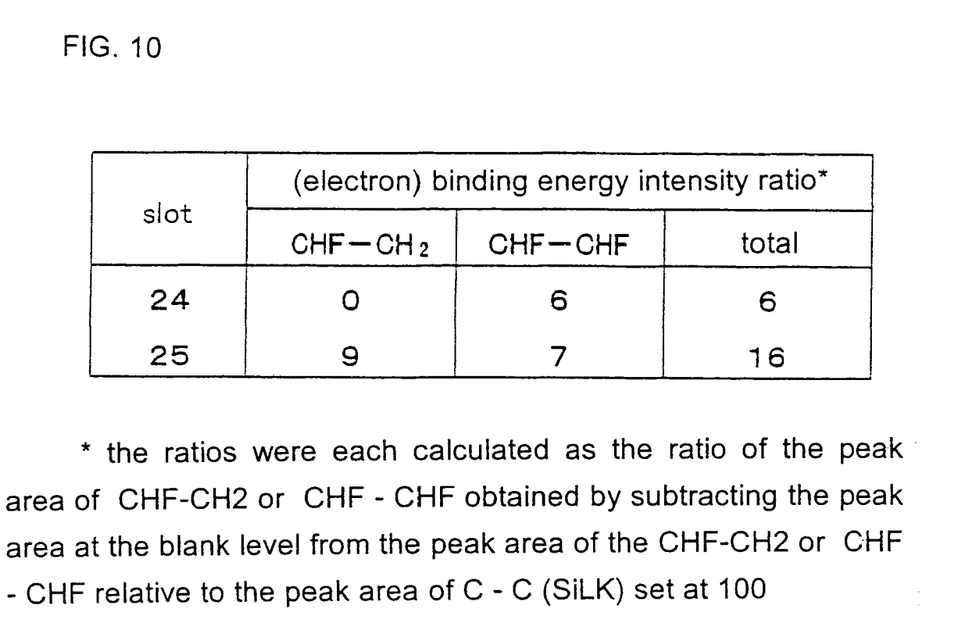
FIG. 10 presents a table of the photoelectron intensity ratio of CHF—CH$_2$ and CHF—CHF resulting from the peak separation.

A further explanation is given on the formation of the protective wall at a processed sidewall of the organic low k film, achieved by adopting the etching method in the embodiment, in reference to FIGS. 8–10. The results presented in FIGS. 8–10 were achieved when wiring grooves were formed by sequentially executing the first step in which the SiN layer is etched using the first process gas and then the first process gas is continuously used to over-etch the SiLK layer and the second step in which the SiLK layer is etched using the second process gas. Slot 24 represents the results achieved by executing the first step over approximately 20 seconds and executing the second step over approximately 60 seconds (i.e., the length of the over-etching time is small), whereas slot 25 represents the results achieved by executing the first step over approximately 60 seconds and executing the second step over approximately 30 seconds (i.e., the length of the over-etching time is relatively large).

FIG. 8 presents raw data obtained by measuring the levels of the electron binding energy manifesting in slot 24 and slot 25 through photoelectron spectroscopy. Each sample was tilted to measure the electron binding energy from a side wall of a wiring groove alone. This made it possible to ascertain the state of a processed SiLK side surface. In this test, the tilt angle was set at approximately 30°. As shown in FIG. 8, the left side slope of the profile of slot 25 (the solid line) achieved higher values than the left side slope of the profile of slot 24 (the dotted line). This means that as the over-etching time lengthens, the CHF—$CH_2$ component and the CHF—CHF component increase. It is to be noted that the higher value achieved by the right side slope of the profile of slot 24 (the dotted line) than the values achieved by the right side slope of the profile corresponding to slot 25 (the solid line) are attributed to a change in the SiLK structure occurring as the $CF_4$ processing time is lengthened.

FIG. 9 shows the separate peaks of the C—C compound, the CHF—$CH_2$ compound and the CHF—CHF compound, obtained by processing the raw C1s orbit electron data in FIG. 8 for slot 24 and slot 25. The data presented in FIG. 9 even more clearly indicates that the quantities of the CHF—$CH_2$ component and the CHF—CHF component in slot 25 (the solid line) are larger than those in slot 24 (the dotted line).

These results are summarized in FIG. 10. FIG. 10 presents the ratios of the peak areas of CHF—$CH_2$ and CHF—CHF, each obtained as the ratio of the peak area calculated by subtracting the peak area at the blank level from the CHF—$CH_2$ peak area or the CHF—CHF peak area relative to the C—C (SiLK) peak area set at 100. FIG. 10 shows that slot 25 with a longer over-etching time achieves higher photoelectron intensity ratios corresponding to CHF—$CH_2$ and CHF—CHF than slot 24 with the shorter over-etching time, resulting in formation of a stronger protective wall at the via side wall.

As described above, by adopting the embodiment, the extent of the shoulder loss occurring at a shoulder formed over the junction region where the trench and the via form a junction can be reduced by over-etching the SiLK layer to a predetermined depth after etching the SiN layer and thus forming a protective wall at the via side wall. It is to be noted that this protective wall should be removed through a washing step executed by using an organic amine solvent or an organic solvent containing ammonium fluoride.

While the etching method in the embodiment of the present invention has been particularly shown and described with respect to the preferred embodiment thereof by referring to the attached drawings, the present invention is not limited to this example and it will be understood by those skilled in the art that various changes in form and detail may be made therein without departing from the spirit, scope and teaching of the invention.

For instance, while an explanation is given by referring to the plasma etching apparatus shown in FIG. 1 as an example of an apparatus in which the etching method in the embodiments may be adopted, the present invention is not limited to this example and it is obvious that the present invention may be adopted in etching apparatuses that use various types of plasma sources as well as in a plane-parallel etching apparatus.

In addition, while an explanation is given above in reference to the embodiment on an example in which the organic low k film is constituted of SiLK, the present invention is not limited to this example. The organic low k film the may be a polynaphthalene, fluoride polymer film, a maleimide benzocyclobutene polymer film, a polyperfluoro/cyclobutene aromatic ether film, a polyimide film, a polyallyl ether film, a parylene film, a diamond hydride film or a polytetrafluoroethylene film. Moreover, the present invention may be adopted in conjunction with a divinyl siloxane benzocyclobutene polymer film having part of its organic macro-molecular film replaced with silica or a polyimide film containing silica.

Also, while the first hard mask constituted of SiN and the second hard mask constituted of oxide are formed as mask layers over the organic low k film in the embodiment described above, the present invention is not limited to this example. Of the mask layers formed over the organic low k film, i.e., the so-called hard masks, the first hard mask may be an insulating film such as a silicon oxide film ($SiO_2$), a silicon carbide film (SiC), a porous silicon nitride film, a silicon oxynitride film (SiON), an aluminum nitride film (AlN) or a silica film as well as a silicon nitride film (SiN). Alternatively, it may be constituted of a metal nitride film such as titanium nitride (TiN) or tantalum nitride (TaN), or a titanium carbide film (TiC). However, when a conductive nitride film such as a TiN film or a TaN film is used, it is necessary to remove the conductive nitride film by polishing it off through chemical machining or through dry-etching after copper is embedded in the wiring grooves and the vias. In addition, the second hard mask may be constituted by using an insulating film such as a silicon nitride film (SiN), a porous silica film, a silicon carbide film or a silicon oxynitride film as well as a silicon oxide film ($SiO_2$). It may instead be constituted with a metal nitride film such as titanium nitride (TiN) or tantalumnitride (TaN), or it may be formed titanium carbide film (TiC). The crucial points that should be kept in mind when selecting materials to constitute the hard masks are: 1) different materials should be selected to constitute the first hard mask and the second hard mask and 2) at least the first hard mask should be etched by using a mixed gas containing at least C and F and a protective wall should be deposited while forming a via hole into the base organic low k film by continuously etching the organic low k film.

In addition, while the SiLK layer is over-etched during the first step to a depth beyond the shoulder at the junction region where the trench and the via form a junction in the embodiment explained above, the present invention is not limited to this example. The depth to which the SiLK layer is over-etched and the length of time over which the SiLK layer is over-etched can be freely set in conformance to the specifications for the final product, and even by over-etching the SiLK layer to a depth short of the shoulder, the shoulder loss reduction effect can be achieved to a certain degree.

While the first process gas is a mixed gas containing $CF_4$, $O_2$ and Ar in the embodiment explained above, the present invention is not limited to this example. The first process gas may be any mixed gas containing a fluorocarbon gas such as $CHF_3$, $C_4F_8$, $CH_2F_2$, $C_4F_6$ or $C_5F_8$, oxygen and a noble gas as long as it enables the formation of a protective wall containing C—F while the organic low k film is etched.

Furthermore, while the second process gas in the embodiment explained above is a mixed gas containing $N_2$ and $H_2$, the present invention is not limited to this example. The second process gas may instead be constituted of ammonia ($NH_3$ gas) or $N_2H_4$. The essential requirements for the second process gas are that it achieve high etching selectivity for the target layer relative to the organic low k film and, at the same time, allow the photoresist to be etched as well and that its etching selectivity for the target layer relative to the hard masks and the protective film (the SiN film 206) on the copper wiring is low (the etching rate at the target layer is relatively low). It is to be noted that the protective film 206 may be a silicon carbide film or a porous silicon nitride film as well.

Moreover, the present invention is not limited in any way whatsoever by the particulars of the processing method explained in reference to the embodiment. As long as an organic low k film and a mask layer formed on the organic low k film are etched through the processing method, the mask layer is first etched using a first process gas in a dual damascene structure having a shoulder in the organic low k film layer and a C—F polymer is then deposited at a via side wall surface by continuously etching the organic low k film layer with the first process gas to a predetermined depth to use the deposited polymer as a protective wall when etching a trench using a second process gas so as to reduce the extent of the shoulder loss occurring at the junction region over the via and the trench, any other process gas may be used after the processing performed by using the first process gas and prior to the processing performed by using the second process gas or following the processing performed by using the second process gas.

As explained above, in the method according to the present invention, after a mask layer such as a SiN layer is etched using a first process gas, e.g., a mixed gas constituted of $CF_4$, $O_2$ and Ar, an organic low k film is also etched by continuously using the first process gas to a predetermined depth, e.g., to a point deep enough to match the position of a shoulder in a dual damascene structure to allow a protective wall constituted of, for instance, a C—F polymer to be deposited at a via side wall during the formation of the dual damascene structure. Then, when etching a trench using a second process gas, e.g., a mixed gas constituted of $N_2$ and $H_2$, the deposited polymer works as a protective wall to reduce the extent of the shoulder loss at the junction region where the via and the trench form a junction. As a result, the shoulder achieves an ideal shape with almost perfect verticality, which, in turn, facilitates the formation of the desired wiring structure. In addition, the length of time required for the manufacturing process can be reduced.

Industrial Applicability

The present invention may be adopted in the process of manufacturing semiconductor devices and, in particular, during the etching process. More specifically, the present invention may be adopted in a method through which it an organic low k film and a mask layer formed over the organic low k film are dry-etched by using at least two process gases to form a dual damascene structure with a shoulder present in the organic low k film layer.

The invention claimed is:

1. An etching method for forming a dual damascene structure having a shoulder in a single organic low k film by dry-etching said organic low k film and a mask layer formed over said organic low k film using at least two different process gases, comprising:

a first step in which said mask layer is etched to form an opening for forming a via hole using a first process gas and then said organic low k film is etched to a predetermined depth by continuously using said first process gas to form said via hole therein, a second step executed after said first step, in which said organic low k film is etched using a second process gas and where a shoulder portion is formed in the organic low k film.

2. An etching method according to claim 1, wherein: said first process gas contains at least C and F.

3. An etching method according to claim 1, wherein: said first process gas is constituted of a mixed gas containing $CF_4$, $O_2$ and Ar.

4. An etching method according to claim 1, wherein: said second process gas contains at least N and H.

5. An etching method according to claim 1 wherein: said second process gas is constituted of a mixed gas containing $N_2$ and $H_2$.

6. An etching method according to claim 1, wherein: etching the mask layer with the first process gas deposits a polymer film on the etched surface.

7. An etching method according to claim 6, wherein the second step forms a trench in the organic low-k layer about the etched surfaces having said polymer film.

8. An etching method for forming a dual damascene structure having a shoulder in a single organic low k film by dry-etching said organic low k film and a mask layer formed over said organic low k film using at least two different process gases, comprising:

a first step in which a silicon compound insulating layer is etched to form an opening for forming a via hole using a first process gas and then said organic low k film is etched at least down to a depth matching the position of the shoulder present in said dual damascene structure by continuously using said first process gas to form said via hole, a second step executed after said first step, in which said organic low k film is etched using a second process gas and where a shoulder portion is formed in the organic low k film.

9. An etching method according to claim 8, wherein: said silicon compound insulating layer is constituted of silicon nitride, silicon oxynitride or silicon carbide, or a mixture thereof.

10. An etching method according to claim 8, wherein: said first process gas contains at least C and F.

11. An etching method according to claim 8, wherein: said first process gas is constituted of a mixed gas containing $CF^4$, $O^2$ and Ar.

12. An etching method according to claim 8, wherein: said second process gas contains at least N and H.

13. An etching method according to claim 8, wherein: said second process gas is constituted of a mixed gas containing $N^2$ and $H^2$.

14. An etching method according to claim 8, wherein: etching the mask layer with the first process gas deposits a polymer film on the etched surface.

15. An etching method according to claim 14, wherein the second step forms a trench in the organic low-k layer about the etched surfaces having said polymer film.

* * * * *

UNITED STATES PATENT AND TRADEMARK OFFICE
CERTIFICATE OF CORRECTION

PATENT NO.        : 7,030,028 B2
APPLICATION NO. : 10/312292
DATED             : April 18, 2006
INVENTOR(S)       : Takuya Mori et al.

It is certified that error appears in the above-identified patent and that said Letters Patent is hereby corrected as shown below:

Claim 3, col. 9, line 11, "$CF^{4,\ 2}$" should read --$CF_4$, $O_2$--.

Claim 11, col. 10, line 17, "$CF^4$, $O^2$" should read --$CF_4$' $O_2$--.

Claim 13, col. 10, line 22, "$N^2$ and $H^2$" should read --$N_2$ and $H_2$--.

Signed and Sealed this

Eighteenth Day of July, 2006

JON W. DUDAS
*Director of the United States Patent and Trademark Office*